(12) United States Patent
Lopez et al.

(10) Patent No.: US 9,818,662 B2
(45) Date of Patent: Nov. 14, 2017

(54) SILICON PACKAGE HAVING ELECTRICAL FUNCTIONALITY BY EMBEDDED PASSIVE COMPONENTS

(71) Applicant: Texas Instruments Incorporated, Dallas, TX (US)

(72) Inventors: Osvaldo Jorge Lopez, Annandale, NJ (US); Jonathan Almeria Noquil, Bethlehem, PA (US); Thomas Eugene Grebs, Bethlehem, PA (US); Simon John Molloy, Allentown, PA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 145 days.

(21) Appl. No.: 14/702,031

(22) Filed: May 1, 2015

(65) Prior Publication Data
US 2016/0133535 A1    May 12, 2016

Related U.S. Application Data

(63) Continuation-in-part of application No. 14/534,254, filed on Nov. 6, 2014.

(51) Int. Cl.
| | |
|---|---|
| *H01L 23/14* | (2006.01) |
| *H01L 23/13* | (2006.01) |
| *H01L 21/50* | (2006.01) |
| *H01L 21/98* | (2006.01) |
| *H01L 21/52* | (2006.01) |
| *H01L 25/16* | (2006.01) |
| *H01L 21/48* | (2006.01) |

(Continued)

(52) U.S. Cl.
CPC ......... *H01L 23/147* (2013.01); *H01L 21/481* (2013.01); *H01L 21/78* (2013.01); *H01L 23/13* (2013.01); *H01L 25/16* (2013.01); *H01L 25/165* (2013.01); *H01L 25/50* (2013.01); *H01L 2924/0002* (2013.01)

(58) Field of Classification Search
CPC ....... H01L 23/13; H01L 23/147; H01L 25/16; H01L 25/165; H01L 25/50; H01L 23/053; H01L 23/057; H01L 23/08; H01L 23/32
See application file for complete search history.

(56) References Cited

U.S. PATENT DOCUMENTS

| | | | | |
|---|---|---|---|---|
| 4,989,063 A | * | 1/1991 | Kolesar, Jr. ............. | H01L 23/13 257/506 |
| 5,008,213 A | * | 4/1991 | Kolesar, Jr. ............. | H01L 23/13 257/E21.505 |

(Continued)

*Primary Examiner* — Robert Bachner
*Assistant Examiner* — Molly Reida
(74) *Attorney, Agent, or Firm* — Jacqueline J. Garner; Charles A. Brill; Frank D. Cimino

(57) ABSTRACT

A packaged electronic system comprises a slab (210) of low-grade silicon (l-g-Si) configured as ridges (114) framing a depression of depth (112) including a recessed central area suitable to accommodate semiconductor chips and embedded electrical components, the depth at least equal to the thickness of the chips and the components, the ridge covered by system terminals (209b) connected to attachment pads in the central area; and semiconductor chips (120, 130) having a thickness and terminals on at least one of opposing chip sides, the chips terminals attached to the central area terminals so that the opposite chip side is coplanar with the system terminals on the slab ridge.

6 Claims, 2 Drawing Sheets

(51) Int. Cl.
   *H01L 25/00*    (2006.01)
   *H01L 21/78*    (2006.01)

(56) References Cited

U.S. PATENT DOCUMENTS

| | | | | |
|---|---|---|---|---|
| 8,592,825 B2* | 11/2013 | Yamaki | ................ | H01L 23/147 |
| | | | | 257/76 |
| 2012/0025204 A1* | 2/2012 | Yamaki | ................ | H01L 23/147 |
| | | | | 257/77 |
| 2012/0146177 A1* | 6/2012 | Choi | ................ | H01L 25/16 |
| | | | | 257/528 |
| 2014/0284731 A1* | 9/2014 | Nakao | ............... | H01L 23/49579 |
| | | | | 257/415 |
| 2016/0229690 A1* | 8/2016 | Nakao | ............... | H01L 23/49579 |

* cited by examiner

SILICON PACKAGE HAVING ELECTRICAL FUNCTIONALITY BY EMBEDDED PASSIVE COMPONENTS

CROSS-REFERENCE TO RELATED APPLICATIONS

This application is a continuation in part of U.S. application Ser. No. 14/534,254 filed Nov. 6, 2014. Said application is incorporated herein by reference.

FIELD

Embodiments of the invention are related in general to the field of semiconductor devices and processes, and more specifically to the structure and wafer scale fabrication method of low-grade silicon packages, which embed multi-chip devices and share electrical functionality by embedding passive components.

DESCRIPTION OF RELATED ART

In the majority of today's semiconductor devices, the semiconductor chip is typically assembled on a substrate such as a metallic leadframe or a multi-level laminate, and encapsulated in a package of a robust material such as ceramic or hardened plastic compound. The assembly process typically includes the process of attaching the chip to a substrate pad or the leadframe pad, and the process of connecting the chip terminals to substrate leads using bonding wires, metallic clips, or solder balls.

The use of widely different materials such as metals, ceramics, and plastics cause challenges not only for mutual parts adhesion, but also for long-term device stability; an example is delamination of adjacent parts. The risk of delamination is magnified by the thermos-mechanical stress in temperature swings during operation and testing due to the widely divergent coefficients of thermal expansion (CTE) of the various materials used. For plastic-packaged semiconductor devices, extensive research has been dedicated to identify corrective measures for device reliability issues caused by the stress due to CTE mismatches; so far, degradation due to stress effects could only be mitigated but not eliminated. In addition, moisture-related degradation of electrical characteristics in plastic-encapsulated devices has been well documented, but has been brought under control only to a certain degree. Much effort has further been extended to prevent the onset of fatigue and cracking in metallic connections in devices after operational temperature excursions, again only with limited success.

Among the popular families of power supply circuits are the power switching devices for converting on DC voltage to another DC voltage. Particularly suitable for the emerging power delivery requirements are the Power Blocks with two power MOS field effect transistors (FETs) connected in series and coupled together by a common switch node; such assembly is also called a half bridge. When a regulating driver and controller is added, the assembly is referred to as Power Stage or, more commonly, as Synchronous Buck Converter. In the synchronous Buck converter, the control FET chip, also called the high-side switch, is connected between the supply voltage $V_{IN}$ and the LC output filter, and the synchronous (sync) FET chip, also called the low side switch, is connected between the LC output filter and ground potential. The gates of the control FET chip and the sync FET chip are connected to a semiconductor chip including the circuitry for the driver of the converter and the controller; the chip is also connected to ground potential.

For many of today's power switching devices, the chips of the power MOSFETs and the chip of the driver and controller IC are assembled horizontally side-by-side as individual components. Each chip is typically attached to a rectangular or square-shaped pad of a metallic leadframe; the pad is surrounded by leads as output terminals. In other power switching devices, the power MOSFET chips and the driver-and-controller IC are assembled horizontally side-by-side on a single leadframe pad, which in turn is surrounded on all four sides by leads serving as device output terminals. The leads are commonly shaped without cantilever extensions, and arranged in the manner of Quad Flat No-Lead (QFN) or Small Outline No-Lead (SON) devices. The electrical connections from the chips to the leads may be provided by bonding wires, which introduce, due to their lengths and resistances, significant parasitic inductance into the power circuit. In some recently introduced advanced assemblies, clips substitute for many connecting wires. These clips are wide and introduce minimum parasitic inductance, but are more expensive than wire bonds and require a more involved assembly process. Each assembly is typically packaged in a plastic encapsulation, and the packaged components are employed as discrete building blocks for board assembly of power supply systems.

SUMMARY

Applicants realized that a radically new approach was needed in order to significantly improve semiconductor transistor devices, including power blocks and power converters, with respect to reducing parasitic resistances and inductances, improving thermal performances and speed, enhancing operational reliability in moist and temperature-variable ambient, letting the package participate in the electrical device functions, and reducing manufacturing cost. The new approach had to be different from the conventional composite package, where semiconductor chips are assembled on a metallic carrier and packaged in a plastic encapsulation, combines materials of widely different coefficients of thermal expansion, leading to a propensity for thermo-mechanical stresses, and requires a lengthy, time-consuming and costly fabrication flow.

Applicants solved substantial materials, functionality, and cost problems of a semiconductor package, when they discovered a structure concept and manufacturing flow for packages, which adopt and parallel the mass production and controlled processes of routine semiconductor wafer manufacturing. The new package is based on using silicon slabs cut from wafers made of low-grade and thus low cost silicon, which can be obtained, for instance, from reclaimed, unrefined, and undoped silicon. While numerous slabs are processed in wafer form, each slab obtains a depression suitable for assembling single-crystal device chips and passive components, enabling the slab to operate as a carrier as well as the final package.

The new package concept eliminates leadframes, bonding wires, clips, solder balls, and plastic, ceramic, and metallic housings; in addition, it creates enough space to place active semiconductor chips and passive components. The fabrication processes use tried-and-true front-end techniques such as etching semiconductors, metals, and insulators, depositing layers of metals, insulators, and passivation, growing insulating layers, and patterning by photoresist technologies.

These processes are flexible enough to form embedded passive components such as precision resistors and capacitors.

The resulting devices no longer suffer from mismatched coefficients of thermal expansion, but instead allow the minimization of thermo-mechanical stresses. In addition, parasitic resistances and inductances are reduced since wire bonds and clips are eliminated. Thermal conductivity and thus electrical performance of the new devices is enhanced by attaching the chips of the finished devices directly onto circuit boards.

The integrated passive components may be created by patterning deposited metallic and insulating layers, or by integrating externally provided piece parts.

DETAILED DESCRIPTION OF THE PREFERRED EMBODIMENTS

Figure 1:
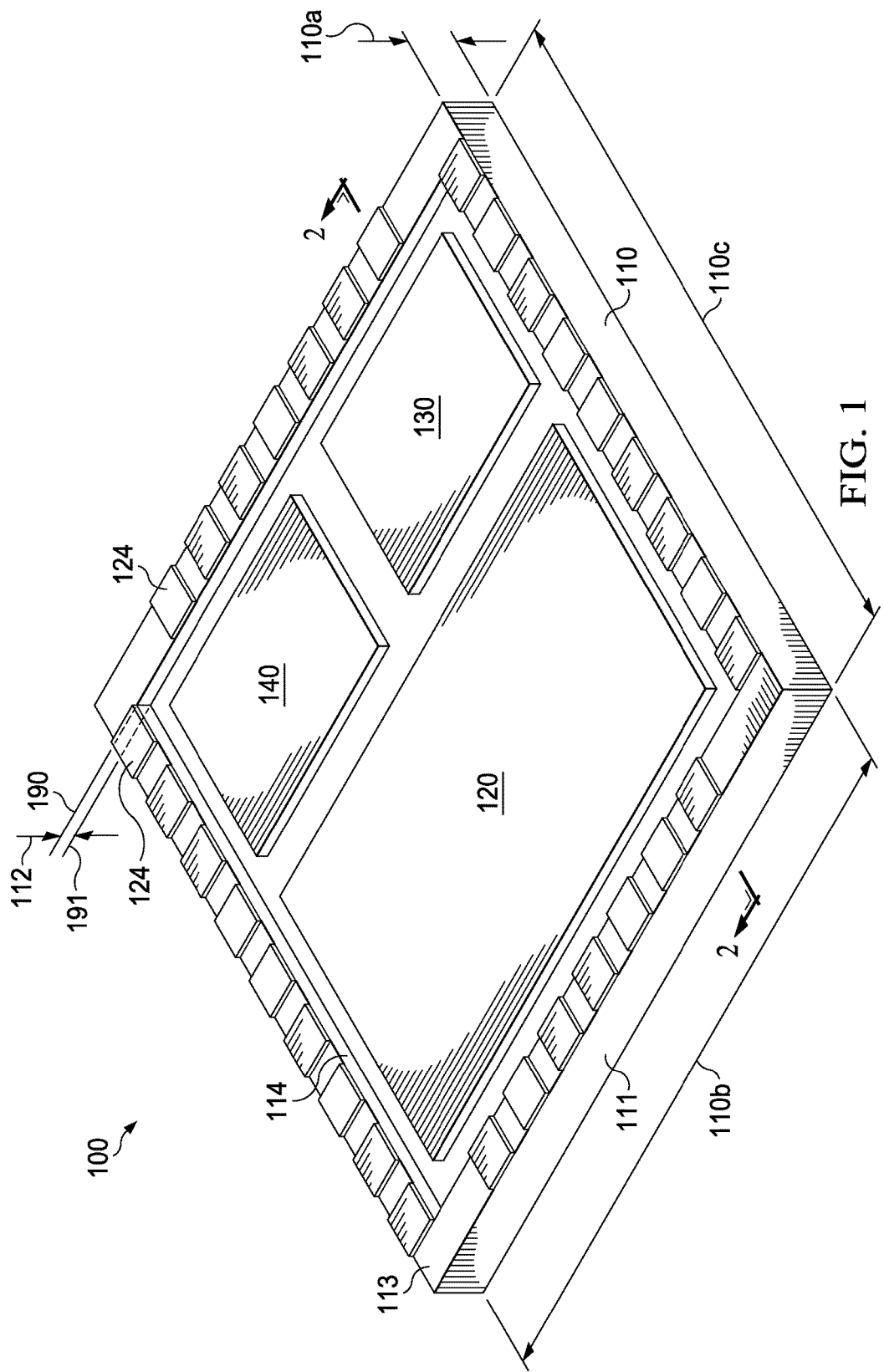
FIG. 1 illustrates a perspective bottom view of an exemplary power supply system assembled in and attached to a low-grade silicon (l-g-Si) package having integrated passive components as electrical functions.

FIG. 1 illustrates electronic device 100 as an exemplary embodiment of the invention. Dependent on the transistors chosen, device 100 may be a packaged power converter system or a packaged regulator. A low-side field effect transistor (FET, drain down) 120, a flipped high-side FET (source down) 130, and a flipped driver-and-controller integrated circuit (IC) 140 are assembled side-by-side on a low-grade silicon (l-g-Si) slab 110, which operates as the package of system 100. In this example, the semiconductor chips include a first set wherein the chips include transistors having terminals distributed on the first and the opposite second chip side, and a second set wherein the chips include an integrated circuit having terminals on one chip side. All chips have preferably the same thickness, for instance 50 µm.

In exemplary device 100, the semiconductor chips are made of single-crystalline silicon. In other embodiments, the semiconductor chip may be made of, for example, silicon-germanium, gallium arsenide, gallium nitride, or other III-V and II-IV compounds used as semiconductor device materials. The silicon chips of device 100 are field effect transistors (FETs) and integrated circuits (ICs). In the embodiment depicted in FIG. 1, drain and gate terminals of the FETs are on opposite chip sides, and some chips need to be flipped to be attached to the package. In other embodiments, source, gate and drain terminals may be differently arranged so that the FETs can be attached to the package without flipping the chips. In still other embodiments, the transistors may be a bipolar transistors having emitter and base terminals on the first side and attached to the package, and the collector contact on the opposite second side facing away from the package; or the bipolar transistor may have the collector and base contact attached to the package with the emitter terminal facing away from the package.

In the exemplary embodiment of a packaged electronic system depicted in FIG. 1, slab 110 is made of low-grade silicon, wherein the low-grade silicon (l-g-Si) is selected from a group including, but not limited to, reclaimed silicon, unrefined silicon, undoped silicon, polycrystalline silicon, intrinsic polycrystalline silicon, lowly doped n-type polycrystalline silicon, and lowly doped p-type polycrystalline silicon. Exemplary slab 110 has a thickness 110a of about 300 µm, a length 110b of about 5.8 mm, and a width 110c of about 3.7 mm. The l-g-Si material is exposed at the edges 111 of the slab, while the slab top side viewed in FIG. 1 is covered by an insulating layer. Portions of the insulating layer are exposed at locations 113, while other portions are covered by a metal layer configured as terminals 124. Included are terminals for the transistor gates and for switch node $V_{SW}$, input $V_{IN}$, ground potential $P_{GRND}$, and the IC pins of the driver/controller chip. The surface of the metal layer is in a plane referred to as first plane 190.

The exemplary slab 110 of FIG. 1 is configured to have four elevated ridges 114, which frame a depression of depth 112. The depression includes a recessed central area suitable to accommodate the semiconductor chips. Depth 112 may be in the range from about 0.05 to 0.1 mm, while slab thickness 110a may be in the range from about 0.3 to 0.5 mm. As stated, the surface of the metal layer on the ridge is in first plane 190; the recessed central area has a second surface in a second plane 191 spaced from the first plane by depth 112, which preferably is equal to the sum of the thickness of a chip and the thickness of the adhesive material used to attach the chip to the recessed central area.

While the exemplary device of FIG. 1 has the ridge surrounding the central area as a rectangular frame, other embodiments may employ ridge configurations, which include a single linear ridge, two ridges parallel to each other at opposite sides of the central area, or three ridges interconnected by right angles.

Figure 2:
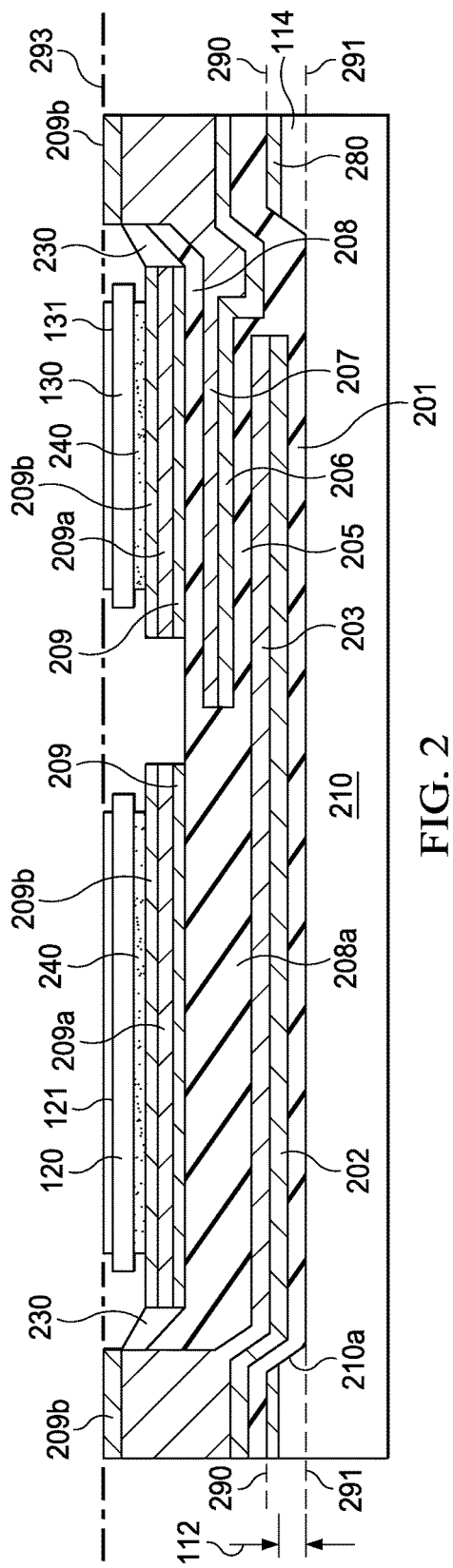
FIG. 2 shows a cross section of the embodiment of FIG. 1 for an undoped or weakly doped low-grade silicon slab; the cross section is taken along the line indicated in FIG. 1.

The depth 112 between the ridge and the central slab area is bridged by a step of the l-g-Si material inclined at an angle less than vertical (see FIG. 2). Consequently, conductive connections such as metal layers can be formed across the steps, connecting the attachment pads with the device terminals; as stated later, it is preferred to cover the connections across the steps with a passivation layer.

With chips 120, 130, and 140 inserted in the depression of slab 110, slab 110 can act as the package of the assembled chips. When the chips are made of silicon, there is practically no longer any difference of the coefficients of thermal expansion between chip and package, and thermo-mechanical stresses are in first order eliminated. Consequently, the risk of material-related delamination between chip and package is diminished and the device reliability is greatly enhanced.

Other embodiments of the invention are a method of fabricating semiconductor slabs suitable as device packages, and further a method of fabricating a packaged electronic system. The process flow of fabricating semiconductor slabs starts with providing a wafer of low-grade silicon (l-g-Si), which includes a plurality of slab sites. The preferred wafer diameter is 300 mm, but smaller diameters may be used. A discrete slab is displayed in FIG. 2 and designated 210. The portion of the wafer surface shown in FIG. 2 is in a first plane 290. While it is preferred that the final wafer before dicing has a thickness of about 300 µm, it is practical to execute the preceding process steps using a thicker wafer and obtain the final thickness by back-grinding. The l-g-Si may be selected from a group including reclaimed silicon, unrefined silicon, undoped silicon, polycrystalline silicon, and intrinsic polycrystalline silicon. For devices with transistor terminals isolated from the slab, as displayed in FIG. 2, the l-g-Si material may also include lowly doped n-type polycrystalline silicon and lowly doped p-type polycrystalline silicon.

In the next process, a first insulating layer 280 is formed on the surface of the wafer, the layer covering all slab sites. The preferred technique of forming an insulating surface layer is thermally oxidizing the silicon. Alternative techniques include depositing a layer of silicon dioxide, silicon nitride, silicon carbide, or a combination thereof, and depositing an insulating compound different from a silicon compound.

Then, the first insulating layer 280 is removed from the central portion of each slab site to expose the underlying l-g-Si, while leaving un-removed the first insulating layer 280 over the peripheral site portions to form a ridge framing each central portion.

In the next process, the exposed l-g-Si of the central area of each slab site is etched, for instance using KOH, to create a depression with a second l-g-Si surface having a flat central portion in a second plane 291 recessed from the first plane by a depth 112. For the device depicted in FIG. 1, the depression has a rectangular configuration; for other devices, other configurations may be used. The depression, which is formed by the etching process, also creates a step 210a of l-g-Si between the first plane 290 and the second plane 291; preferably, step 210a is inclined less than 90°, and more preferably, the step forms a gradual slope between the first and the second Ig-Si surface so that an uninterrupted metal layer can be deposited.

Next, a second insulating layer 201 is formed on the second silicon surface, which covers all slab sites. While other techniques are possible, preferably the second insulating layer is thermally grown so that the silicon dioxide of the second layer 201 merges with the left-over silicon dioxide of the first layer 280.

Thereafter, at least one layer 202 of metal is deposited onto the second insulating layer 201, covering all slab sites. Preferably, first a layer of a refractory metal such as titanium is selected, followed by a compound layer such as titanium nitride. Alternative choices include a layer of tungsten, or titanium-tungsten, or another refractory metal. The refractory metal 202 adheres strongly to insulating layer 201. Then, a layer 203 of aluminum is deposited onto the refractory metal layer; layer 203 is preferably thicker than layer 202. Portions of layers 202 and 203 serve as a plate for an embedded capacitor, other portions may be patterned as precision resistors.

In the next process, another insulating layer 205 is formed, again preferably as thermally grown silicon dioxide; other insulators may be deposited. In the example discussed in FIG. 2, insulating layer 205 is going to operate as the insulator of a thin film capacitor integrated as an embedded passive component in the silicon package. For the packaged system 100, the capacitor is intended to serve as the input or the output capacitor of the converter of FIG. 1.

Thereafter, another at least one metal layer is deposited and patterned, analogous to layers 202 and 203. In FIG. 2, layer 206 is made of a refractory metal, and layer 207 is made of aluminum. The patterning of these metal layers if performed so that the geometry of the metal layers together with the thickness of dielectric layer 205 creates a capacitance in the range from about 2 to 20 nF. As an example, for the dielectric constant of silicon dioxide of 3.9 and a dielectric thickness of about 140 nm, a capacitance area of 20 mm$^2$ is needed to create a capacitor of 5 nF.

It should be noted that FIG. 2 is schematic and not to scale. Consequently, otherwise uniform layers, such as metal layers 203 and 207, may exhibit bulges in FIG. 2 which are artifacts of the drawing.

The steps for fabricating a capacitor described above can be repeated two or more times, resulting in a plurality of thin-film capacitors embedded in the package of the device (operating, for instance, as converter input and output capacitors) and properly tied by patterned connectors to semiconductors chips and other system components.

Metal layers 206 and 207 are covered with another dielectric layer 208. When the dielectric material is again thermally grown silicon dioxide as has been used for layer 205, layers 208 and 205 can grow together to form thicker region 208a, as shown in FIG. 2.

Next, metal refractory layer 209 and aluminum layer 209a are deposited in the central site portion of each slab site. In addition, preferably a layer of nickel and a thin layer of gold (both layers designated 209b in FIG. 2) are deposited on top of the aluminum layer in order to facilitate the attachment to carrier terminals; a preferred method of deposition is electroless plating. These metal layer are then patterned to for a plurality of pads matching the terminals of a transistor; in addition, the metal on the ridges is retained as terminals. As an example, the matching pads may include the source terminal and the gate terminal of an FET (high side) and the drain terminal and gate terminal of another FET (low side). In addition, the patterning preserves a trace connected with a carrier terminal, which may, for example, operate as connection to ground potential.

After the patterning, a layer 230 of passivation material such as silicon nitride is deposited onto the patterned metal layer, covering all slab sites. Passivation layer 230 is then removed, at each slab site, from the terminals on the ridges and from the pads in the central portion in order to expose the underlying metal; on the other hand, the passivation material over the slopes and between the pads is left un-removed.

In the next process step, a plurality of chips 120 and 130 is provided, which include transistors with terminals on the first and the second chip side. As an example, the chips may have a FET with a source terminal and a gate terminal on one chip side and a drain terminal on the opposite chip side. The chip terminals are then attached to respective pads in the central portion of each slab site; the attachment is performed so that the terminals of the opposite chip sides are co-planar with the metal layer of the ridges framing each central slab portion. In FIG. 2, the plane of co-planarity is designated 293. It is preferred that for the attaching process of the chip to the slab, an adhesive conductive polymeric compound 240 is used, such as a B-stage epoxy or polyimide. Alternatively, a solder compound or a z-axis conductor may be employed.

It is preferred to protect the slopes of the slabs with a protective overcoat 230. Thereafter, the process flow continues by including the process of sawing the l-g-Si wafer in order to singulate a plurality of slabs 210, each slab packaging a discrete system. While saw blades may be used, it is preferred that the sawing process is performed by a laser technique.

After the attachment, the metal layers 209b of the ridges have morphed into system terminals, and each slab 210 has morphed into the package of an electronic system. Embedded in the package are passive components such as capacitors and resistors, which are tied and integrated into the circuitry of the system and render the silicon package electrically functional.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors, to bipolar transistors, insulated gate transistors, thyristors, and others.

As another example, the above considerations for structure and fabrication method of power converters apply to regulators, multi-output power converters, applications with sensing terminals, applications with Kelvin terminals, and others.

As another example, the high current capability of the packaged transistors and converter can be further extended, and the efficiency further enhanced, by using the blank backside of the l-g-Si, after attachment of the devices to a board, so that the back side can be connected to a heat sink, preferably. In this configuration, the device can dissipate its heat into the board as well as into the heat sink.

It is therefore intended that the appended claims encompass any such modifications or embodiments.

We claim:

1. A packaged electronic system comprising:
a slab of silicon having one side covered by an insulating layer, the slab configured as a ridge framing a depression including a recessed central area, the ridge having a first surface in a first plane and the recessed central area having a second surface in a second plane spaced from the first plane by a depth, portions of the ridge covered by a first metal layer configured as system terminals, the recessed central area covered by a second metal layer; and
semiconductor chips and discrete electrical components in the recessed central area, wherein surfaces of the semiconductor chips and the discrete electrical components are coplanar with a surface of the ridge.

2. The system of claim 1, wherein the semiconductor chips include a first and a second set, each chip of the first set including a transistor with terminals distributed on the first and the opposite second chip side, each chip of the second set including one of an integrated circuit and the discrete electrical components.

3. The system of claim 2, wherein the discrete electrical components include passive and active components.

4. The system of claim 3 wherein the packaged electronic system is a power converter having as first set a low-side chip with a drain-down MOSFET and a high-side chip with a source-down MOSFET, and as second set a chip with a driver-and-controller circuit and all terminals on one side, the low-side chip having the drain terminal on the first chip side and the source and gate terminals on the second chip side, the high-side chip having the source terminal on the first chip side and the drain and gate terminals on the second chip side.

5. The system of claim 1 wherein:
the semiconductor chips include chip terminals attached to the second metal layer;
the discrete electrical components include component terminals attached to the second metal layer; and
the discrete electrical components include a thickness equal to or lesser than a thickness of the semiconductor chips.

6. The system of claim 5 wherein:
surfaces of the semiconductor chips and the discrete electrical components are coplanar with a surface of the first metal layer; and
the slab serves as the package of the system.

* * * * *